United States Patent [19]

Grudkowski

[11] Patent Number: 5,309,004
[45] Date of Patent: May 3, 1994

[54] HETEROSTRUCTURE ACOUSTIC CHARGE TRANSPORT DEVICE HAVING ELECTRON AND HOLE TRANSPORT

[75] Inventor: Thomas W. Grudkowski, Glastonbury, Conn.

[73] Assignee: United Technologies Corporation, Hartford, Conn.

[21] Appl. No.: 773,979

[22] Filed: Oct. 8, 1991

Related U.S. Application Data

[63] Continuation of Ser. No. 545,388, Jun. 27, 1990, abandoned.

[51] Int. Cl.$^5$ .................. H01L 29/796; H01L 29/205
[52] U.S. Cl. ............................. 257/216; 257/183.1; 257/222; 257/245; 257/912; 310/313 R
[58] Field of Search ............. 357/4, 16, 24, 30 E; 310/313 R, 313 A; 257/183.1, 245, 216, 219-224

[56] References Cited

U.S. PATENT DOCUMENTS

| | | | |
|---|---|---|---|
| 4,799,244 | 1/1989 | Mikoshiba et al. | 357/24 |
| 4,884,001 | 11/1989 | Sacks et al. | 310/313 A |
| 4,893,161 | 1/1990 | Tanski et al. | 357/24 |
| 4,926,083 | 5/1990 | Merritt et al. | 310/313 R |
| 4,980,596 | 12/1990 | Sacks et al. | 310/313 R |

OTHER PUBLICATIONS

Kroemer "Heterostructure Device Physics: Band Discontinuities as Device Design Parameters" VLSI Electronics: Microstructure Science vol. 10 (1985) pp. 121-165.

Sze *Physics of Semiconductor Devices* 2nd Edition John Wiley, N.Y. 1981 pp. 20-23, 122-129.

Negative Charge, Barrier Heights, and the Conduction-Band Discontinuity in $Al_xGa_{1-x}$ as Capacitors by Hickmott et al.; pp. 2844-2853 J. Appl. Phys. 57B Apr. 1985.

*Primary Examiner*—Gene M. Munson
*Attorney, Agent, or Firm*—McCormick, Paulding & Huber

[57] ABSTRACT

A novel heterostructure acoustic charge transport (HACT) device is disclosed which displays both electron and hole transport. The device includes a transducer fabricated on a substrate structure that launches surface acoustic waves. An optional reflector is formed in the substrate structure at an end portion adjacent to the transducer for reflecting the surface acoustic waves. Also included is an electrode configured with the transport channel at an end thereof distal to the transducer for generating electrical signal equivalents of the propagating electrode charge. The device makes use of both the conduction band quantum well to transport electrons and the valance band quantum well to transport holes. In this manner the sampling, processing and detection frequencies of the device can be doubled.

13 Claims, 5 Drawing Sheets

HETEROSTRUCTURE ACOUSTIC CHARGE TRANSPORT DEVICE HAVING ELECTRON AND HOLE TRANSPORT

This is a continuation patent application which relates to the parent U.S. Ser. No. 545,388 filed on Jun. 27, 1990 now abandoned.

TECHNICAL FIELD

This invention relates to acoustic charge transport devices fabricated in III-V materials and more particularly to devices displaying hole transport and/or both electron and hole transport.

CROSS-REFERENCE TO RELATED APPLICATIONS

Some of the subject matter hereof is disclosed and claimed in the commonly owned U.S. patent applications entitled "Optically Modulated Acoustic Charge Transport Device", Ser. No. 283,624; U.S. Pat. No. 4,926,083 dated May 15, 1990; "Acoustic Charge Transport Device Having Direct Optical Input", Ser. No. 283,618, U.S. Pat. No. 4,980,596 dated Dec. 25, 1990; and "A Monolithic ElectroAcoustic Device Having An Acoustic Charge Transport Device Integrated With A Transistor", Ser. No. 283,625, U.S. Pat. No. 4,884,001 dated Nov. 28, 1989; each of which is incorporated herein by reference.

BACKGROUND OF THE INVENTION

Acoustic charge transport (ACT) phenomena in III-V semiconductor material has only recently been demonstrated. Such devices have applications as high speed analog signal processors. Delay lines have been fabricated in gallium arsenide (GaAs) devices comprising a surface acoustic wave (SAW) transducer that launch a surface acoustic wave along an upper layer of a GaAs structure that has a transport channel formed therein. An input electrode sources charge to be transported by the propagating electric potential wells and an electrode is present for receiving a signal for modulating that charge. Spaced down the transport channel are one or more nondestructive sensing (NDS) electrodes for sensing the propagating charge. There is also an ohmic output electrode for removing the charge.

Initial acoustic charge transport devices were comprised of a thick epilayer (TE-ACT), with vertical charge confinement accomplished by means of an electro-static DC potential applied to metal field plates on the top and bottom surfaces of the GaAs substrate. The field plate potentials are adjusted to fully deplete the epilayer and produce a potential maximum near the mid-point thereof. Consequently, any charge injected into the channel is confined to the region of maximum DC potential.

Lateral charge confinement (Y direction) has been achieved in several ways. Typically, a mesa is formed to define a charge transport channel. However, for thick epilayer acoustic transport devices, the mesa must be several microns in height, a fact which presents problems in fabrication. Blocking potentials extending down both sides of the delay line have also been used to define the transverse extent of the channel, as has proton bombardment to render the material surrounding the channel semi-insulating.

A heterostructure acoustic charge transport (HACT) device (HACT) has been fabricated using a GaAs/Al-GaAs heterostructure that is similar to that of quantum well lasers and heterostructure field effect transistors FET (e.g. HFET, MODFET, HEMT and TEGFET devices). A HACT device is comprised of a sequence of epitaxial layers and vertically confines mobile carriers through the placement of potential steps that result from band structure discontinuities. Besides providing for inherent vertical charge confinement, the HACT devices are thin film devices whose layers have a total thickness of approximately 0.25 microns, excluding a buffer layer. A cap layer is provided with a HACT device both to protect an upper (AlGa)As layer and to permit fabrication of low resistance ohmic contacts and low leakage Schottky metalization.

Prior ACT and HACT devices display only electron transport. For example, a GaAs ACT structure characterized by thick epitaxial material is only capable of electron transport if constructed using n-type thick (5 micron) GaAs layers. In single electron carrier transport device, only half of the acoustic wavelength is used for signal sampling, processing and detection. This fact reduces the sampling frequency and processing bandwidth of the device to one half the frequency of the surface acoustic wave. It would be advantageous to have a acoustic charge transport device which would support both electron and hole transport by the propagating surface acoustic wave, thereby allowing for increased sampling speed and improved device performance. The present invention is drawn towards such a device and also applies to the use of hole transport only.

SUMMARY OF THE INVENTION

An object of the present invention is to provide a semiconducting acoustic charge transport device characterized by both electron and hole transport.

Another object of the present invention is to provide a semiconducting acoustic charge transport device characterized by hole transport.

According to the present invention an acoustic charge transport device is formed on a gallium arsenide structure and includes a transducer fabricated on a first surface thereof for launching surface acoustic waves along a propagation axis. The surface acoustic waves are characterized by maxima and minima of electrical potential and provide transport for both electrons and holes provided thereto. For example, in one embodiment for electron and hole injection, electrons are provided by a first electrode, with holes provided by a second electrode spaced from the first electrode by one half the wavelength of the surface acoustic waves. In another embodiment, the electron and hole injection may be provided by laterally offset sources. Optical injection is also possible. An optional reflector is formed in the surface at an end portion there adjacent to the transducer for reflecting the surface acoustic waves. The device has a transport channel formed in the gallium arsenide structure that is characterized by an intrinsic vertical and lateral electrical potential such that electrons and holes therein are confined to the surface acoustic waves. The device also includes a third electrode configured with the transport channel at an end thereof distal to the transducer for generating an electrical signal equivalent of the propagating electrons and holes. The transport channel comprises a first layer of aluminum gallium arsenide epitaxially grown on a gallium arsenide substrate. A first layer of gallium arsenide is grown on the aluminum gallium arsenide layer, with a second layer of aluminum gallium arsenide grown on the first layer of gallium arsenide. A second layer of gallium arsenide is grown on the second layer of aluminum gallium arsenide. The second layer of aluminum gallium arsenide is doped to minimize both electron and hole traps in the device, thereby optimizing both electron and hole transport.

According to another aspect of the present invention, an acoustic charge transport device is formed on a gallium arsenide structure and includes a transducer fabricated on a first surface thereof for launching surface acoustic waves along a propagation axis. The surface acoustic waves are characterized by maxima and minima of electrical potential and provide transport for both electrons and holes provided thereto. Electrical "holes" are provided by a first electrode. The device has a transport channel formed in the gallium arsenide structure that is characterized by an intrinsic vertical and lateral electrical potential such that holes therein are confined to the surface acoustic waves. The device also includes an electrode configured with the transport channel at an end thereof distal to the transducer for generating an electrical signal equivalent of the propagating holes. The transport channel comprises a first layer of aluminum gallium arsenide epitaxially grown on a gallium arsenide substrate. A first layer of gallium arsenide is grown on the aluminum gallium arsenide layer, with a second layer of aluminum gallium arsenide grown on the first layer of gallium arsenide. A second layer of gallium arsenide is grown on the second layer of aluminum gallium arsenide. The second layer of aluminum gallium arsenide is doped to minimize hole traps in the device.

DESCRIPTION OF THE PREFERRED EMBODIMENT

Figure 1:
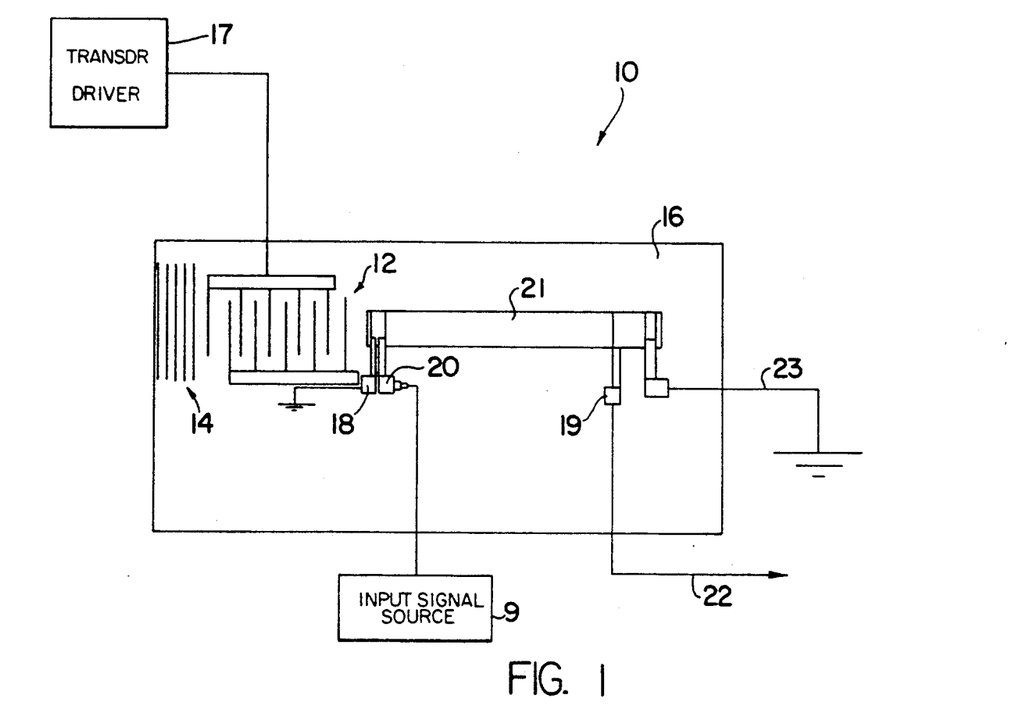
FIG. 1 is a simplified illustration of a heterostructure acoustic charge transport (HACT) device provided in accordance with the present invention.

Referring now to FIG. 1 there is a schematic illustration of an acoustic charge transport device provided according to the present invention. The device 10 is preferably comprised of a III-V material, such as GaAs and AlGaAs which is both piezoelectric and semiconducting. As is known, these materials are very closely lattice matched, having lattice parameters that differ by less than 0.0008 nm. As a result, their ternary solutions are nearly ideal for preparation by epitaxial growth. In addition, the energy band gap of an AlGaAs compound (AlxGa1-xAs) increases monotonically with the parameter x up to x approximately equal to 0.4, at which point the band gap of the ternary becomes indirect. Potential steps as large as 0.3 ev can be obtained in a GaAs/AlGaAs heterostructure device. Moreover, the heterojunction band structure potential is a property of the composite material alone and is not diminished by the transport charge load.

On the surface of the device 10 there is formed a surface acoustic wave transducer 12 and optional reflector 14. The transducer is fabricated in a known manner and preferably comprises an inter-digitated (IDT) transducer of, for example, aluminum copper alloy deposited on device top surface 16. A surface acoustic wave is launched along surface 16 via the transducer by means of signals presented by transducer driver 17. Similarly, the optional reflector 14 is optional and of a known type for reflecting the surface acoustic wave along the surface 16. Charge is provided via input ohmic contact 18 and is received by potential wells of the surface acoustic wave. The charge is modulated by means of signals present to input Schottky contact 20 and is propagated along a transport channel 21. Output Schottky electrode 19 provides signals on line 22 corresponding to the modulated charge presented thereto. Finally, the charge is extracted from the device at the output ohmic electrode 23.

Figure 2:
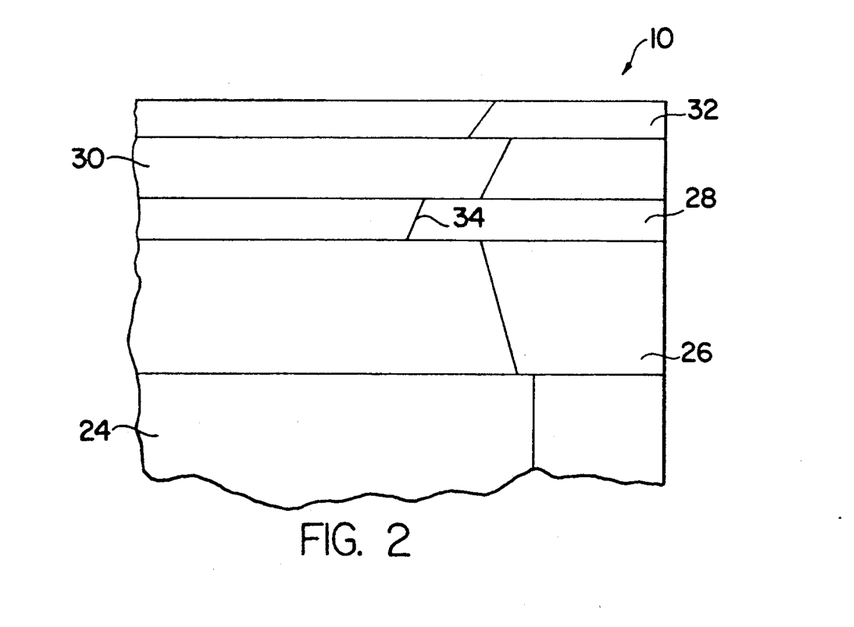
FIG. 2 is a diagrammatic illustration showing conduction band potential across several material layers in the device of FIG. 1.

FIG. 2 is a sectioned diagrammatic illustration of the device 10 of FIG. 1 detailing the epitaxially grown layers thereof. It is preferable that the device layers detailed herein be fabricated by molecular beam epitaxy (MBE), although other methods of epitaxial growth which provide the same purity can be substituted. As described hereinabove, the device 10 is a thin film heterostructure device whose charge confinement layers have a total thickness typically less than 0.25 micron, excluding any buffer layer.

On a semi-insulating GaAs substrate 24 there is formed a first, unintentionally doped 100 nm thick layer 26 of (AlGa)As which itself receives a 40 nm thick layer 28 of GaAs which comprises the transport channel. A second, doped layer 30 of (AlGa)As is grown on the layer 28 to a thickness of about 70 nm. Finally, there is a 0.2 nm cap layer 32 of nonintentionally doped (NID) GaAs that chemically passivates the device by preventing oxidation of the (AlGa)As charge control layer and aids in electrical contact formation.

The device 10 provides vertical charge confinement through formation of a potential well indicated at curve 34 within a GaAs/AlGaAs layered structure using the differences in the valance band energies of the contiguous layers. No external applied potentials are required for charge confinement in the vertical direction in the device 10. Although lateral confinement of the propagating charge in the transport channel can be accomplished by proton implant to produce a semi-insulating area surrounding the transport channel on the surface, Mesa isolation can also be employed.

Prior ACT and HACT devices have only considered electron transport. The known GaAs ACT structure, using thick epitaxial material is only capable of electron transport if constructed using n-type thick (5 micron) GaAs layers. A hole transport, thick epi ACT device can also be made if the thick GaAs epitaxial layer is p-type. Similarly in the HACT device 10, layer 30 is doped to be p-type using known dopants and is fabricated with a doping level selected to minimize the number of hole traps in the device. The precise dopant values vary and are a function of the material configuration of the device layers. Those skilled in the art will note that a layer of aluminum nitride or its equivalent can be added to electrically passivate dangling bonds which would otherwise be present at the air-upper GaAs layer surface interface.

Figure 3:
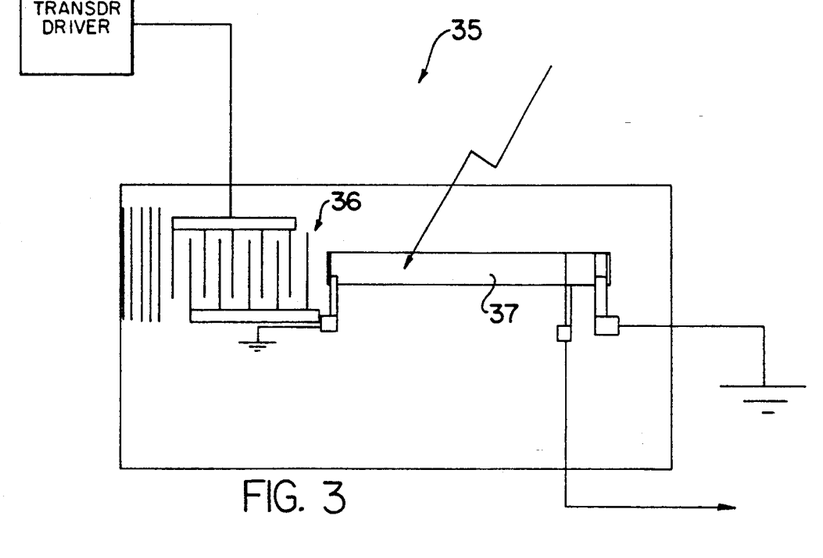
FIG. 3 is a simplified illustration of a second heterostructure acoustic charge transport (HACT) device provided in accordance with the present invention.

FIG. 3 is a schematic illustration of an optically modulated HACT device 35 characterized by hole transport. The device 35 is similar to the device 10 of FIG. 1 in that it includes such elements as a transducer 36 and transport channel 37, but is without an input Schottky contact. Charge modulation is provided by optical input to the transport channel in a manner similar to that described and claimed in the commonly owned U.S. patent application Ser. No. 283,624 entitled "Optically Modulated Acoustic Charge Transport Device", incorporated herein by reference.

Figure 4:
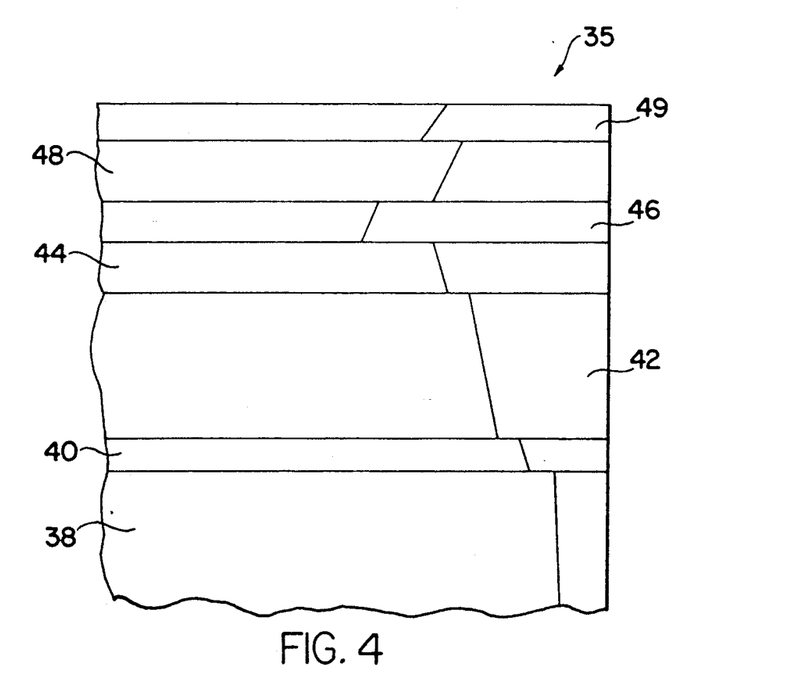
FIG. 4 is a diagrammatic illustration showing conduction band potential across several material layers of the device of FIG. 3.

A sectioned, schematic view of the device 35 is presented in FIG. 4. On a semi-insulating GaAs substrate 38 there is formed a GaAs layer 40, preferably 30 nm in thickness, which is doped to approximately $3 \times 10^{17}/cm^3$. On this p-type layer 40 is grown an unintentionally doped approximately one micron thick layer 42 of GaAs. A first, unintentionally doped 100 nm thick layer 44 of (AlGa)As is then grown on the layer 42, which itself receives a 40 nm thick layer 46 of GaAs which forms the transport channel.

A second, upper layer 48 of (AlGa)As is grown on the layer 46 with a doping of $2 \times 10^{17}/cm^3$ and a thickness of about 70 nm. Finally, there is a 0.2 nm cap layer 49 of nonintentionally doped (NID) GaAs formed in order to prevent oxidation of the (AlGa)As charge control layer and to aid in electrical contact formation.

As demonstrated by the valance band potentials shown therein, a potential well about 0.2 ev deep is created in the GaAs layer 46 which serves to confine the charge in the transport channel. The thickness and doping level of the (AlGa)As layer 48 is designed to provide a sufficient number of holes to fill the surface states therein while leaving the remainder of the structure essentially free of excess carriers. As in the device of FIG. 1, a mole fraction of 32% aluminum was used. As noted above, the present heterostructure structure provides for vertical hole confinement and eliminates the need for backgating considerations and external biasing that is otherwise necessary for conventional acoustic charge transport devices. The GaAs transport channel is undoped to provide high carrier mobility, and there is an increased hole transfer efficiency due to a limited charge packet volume and lower bulk hole trapping.

In the device of FIG. 3, there is a thin p-type GaAs or (AlGa)As layer formed approximately one micron below the transport channel, while also including the thin, n-type (AlGa)As layer typically present in a heterojunction ACT structure. A p-type-intrinsic-n-type (p-i-n) material is formed by this structure. The thickness and doping of the p-type layer should be selected to ensure that the transport layer will be fully depleted of mobile carriers. The present invention is characterized by an epitaxial material structure that generates an intrinsic vertical electric field such that holes are swept towards the transport channel where they are captured by the potential minimum. The holes are transported and ultimately sensed.

The transport channel formed in the device 36 differs from a double heterostructure FET (or HEMT) devices in that the charge in a FET transistor is supplied by donors in the (AlGa)As layers. However, in the HACT device 36, the transport channel is ideally initially empty and charges are injected into the channel or are otherwise provided, such as by direct optical input. The intrinsic electric field formed in the layers (as well as by the periodic SAW potential) immediately adjacent the transport channel prevents any electron-hole charge pairs from recombining.

A device constructed in accordance with the present invention has further differences than earlier HACT devices that employ electron transport. For example, the input signal diode has been previously described as being comprised of an ohmic contact for electrons, not for holes. The input diode ohmic contact for injecting electrons is different than one for injecting holes. For holes, a p-type ion implanted region and p-type ohmic contact are used as part of the input diode. For GaAs, a p-type ohmic contact would be made using Be, Mg or Zn implanted or diffused areas, rather than Si or S implanted areas for an n-type contact.

Figure 10:
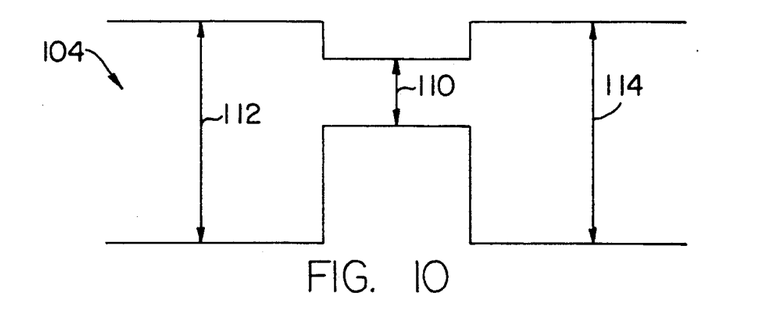
FIG. 10 is a simplified schematic illustration of energy band diagrams of a heterostructure device providing both hole and electron transport.
Figure 11:
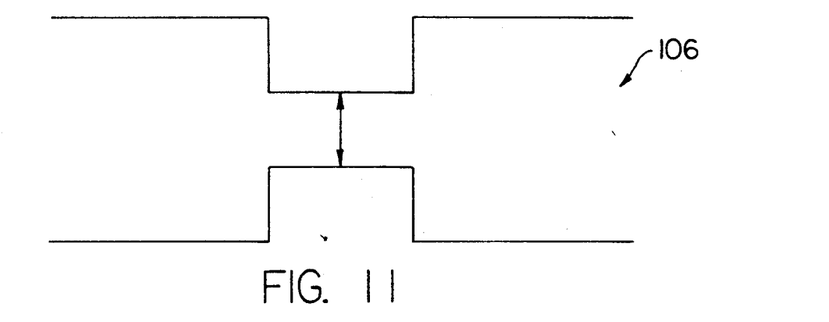
FIG. 11 is a schematic illustration of energy band diagrams of an alternative heterostructure device providing both hole and electron transport.
Figure 12:
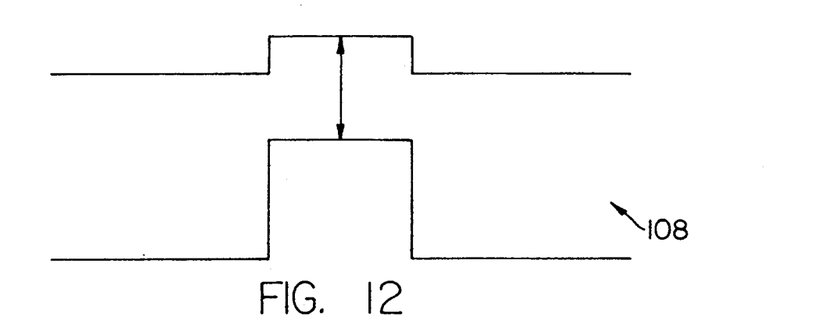
FIG. 12 is a simplified schematic illustration of a device providing hole transport only.

A more basic difference between an electron HACT device and a hole HACT device can be seen by examining channel energy band diagrams 104, 106 and 108 as shown respectively in FIGS. 10, 11, and 12. For example in FIG. 10 the semiconducting transport channel layer has a bandgap energy 110 (Eg1) and is bounded by two semiconducting layers having a larger bandgap (Eg2) 112, 114. The conduction and valence band relationship is a function of the semiconducting material layer composition and their respective electron affinities. For good electron transport, the conduction band energy (Ec) should be large and negative (i.e. near 0.25 ev for the standard AlGaAs/GaAs/GaAs structure). Likewise, for good hole transport, the valance band energy (Ev) should be large and positive, as shown.

If only electron transport is desired, the conduction band energy Ec should be optimized. If only hole transport is desired, the valance band energy Ev should be optimized. If both are desired, the relative values of Eg and Ec are both important. For GaAs/AlGaAs junctions, the band relationships depend on the percent Aluminum in the AlGaAs layers. For the typical 30% aluminum concentration, Eg is about 0.25 ev and Ev is about 0.19 ev. Therefore, a device constructed accordingly will be adapted for either or both electron and hole transport.

Material combinations such as GaAs/Ge/GaAs (Ec=0.23 ev, Ev=0.53 ev), ZnSe/GaAs/ZnSe (Ec=0.4 ev, Ev=1.05 ev), AlGaAs/GaAs/AlGaAs (Ec=0.25 ev, Ev=0.19 ev) and GaAs/InAs/GaAs (Ec=0.89 ev, Ev=0.17 ev) can be used to construct a device according to the present invention. Note that some material combinations are better for hole transport than for electrons. Not all material combinations can be used for electrons and holes. For example, InAs/GaSb- /InSb has Ec = −0.14 ev and Ev = 0.51 ev as shown in FIG. 12, so that combination cannot be used for electrons, but provides a device according to the present invention with good hole transport.

Note also that practical considerations and details of the epitaxial material growth process, such as lattice matching, etc., may indicate which layers can be best grown for good HACT channel properties. It is preferable that the layers be lattice matched, such as by adjusting the layer's constituent composition or by crystallographic orientation. Where it is not possible to lattice match the layers, it is possible to grow a layer of reduced thickness. It is also not necessary that the channel be symmetrical, i.e. a GaAs channel layer can be sandwiched by an AlGaAs layer and a ZnSe layer. Such nonsymmetrical channels offer another technique for optimizing electron transport, hole transport, or electron and hole transport.

Figure 5:
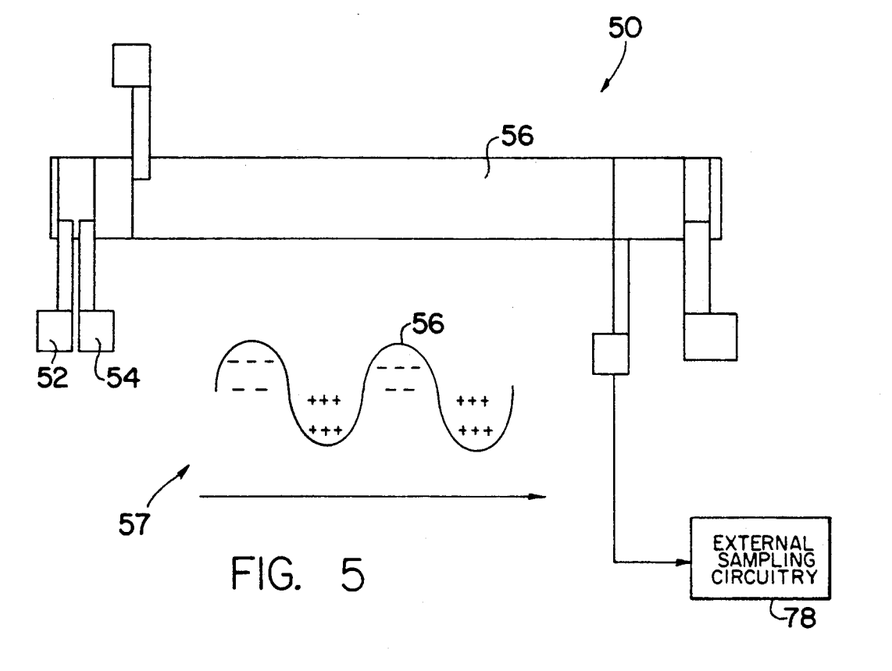
FIG. 5 is simplified illustration of a portion of a bipolar acoustic charge transport device provided according to the present invention.

Referring now to FIG. 5, there is schematically shown a top view of a portion of a bipolar transport device 50 provided according to the present invention. The device 50 is characterized by input ohmic contacts 52 and 54 which are spaced apart along transport channel 56 approximately one half of the SAW wavelength. In all other aspects, the device 50 is the same as the device 10. Devices which employ electron transport in the conduction band potential well are known. However, the valence band potential well is also capable of hole transport, as detailed hereinabove. Carrier type separation is accomplished automatically in the device 50 by the alternating positive/negative surface acoustic wave (SAW) potential of the propagating surface acoustic wave. The device 50 marks an important point of departure from the prior art in that it displays both electron and hole transport simultaneously.

Figure 6:
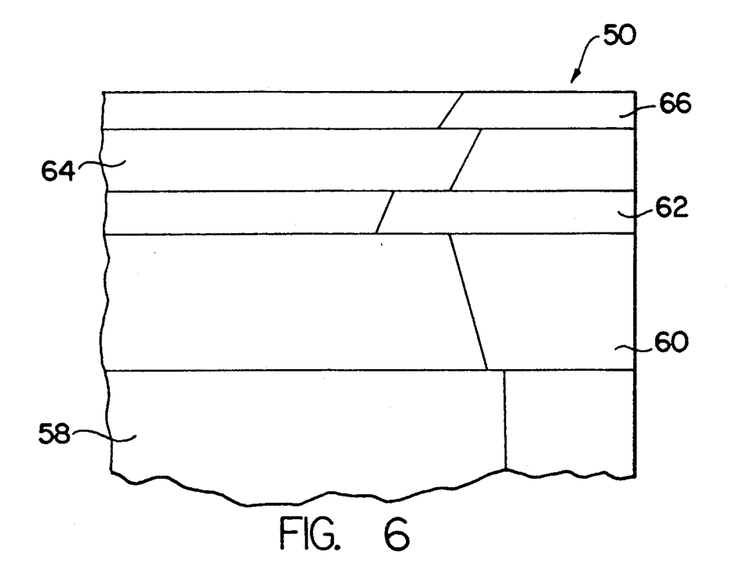
FIG. 6 is a diagrammatic illustration showing conduction band potential across several material layers in the device of FIG. 5.

FIG. 6 is a simplified, sectioned illustration of the device 50. On a semi-insulating GaAs substrate 58 there is formed a first, unintentionally doped 100 nm thick layer 60 of (AlGa)As which itself receives a 40 nm thick layer 62 of GaAs that comprises the transport channel. A second, doped layer 64 of (AlGa)As is grown on the layer 62 to a thickness of about 70 nm. Finally, there is a 0.2 nm cap layer 66 of nonintentionally doped (NID) GaAs that chemically passivates the device by preventing oxidation of the (AlGa)As charge control layer and aids in electrical contact formation.

Figure 7:
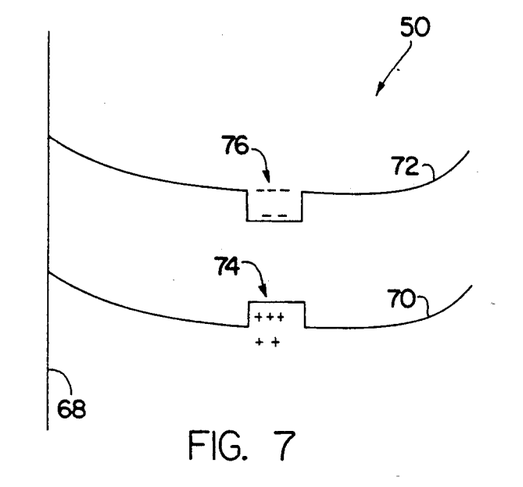
FIG. 7 is a diagrammatic illustration of the valance and conduction band potential for the device of FIG. 5.

FIG. 7 is a simplified diagram showing the band structure of the III-V material layers which comprise the device 50. In FIG. 7, curve 68 corresponds to the surface of the device. Curve 70 corresponds to the valance band potential, while curve 72 corresponds to the conduction band potential. Wells 74 and 76 are the valance and conduction band potential wells in the device which provide vertical confinement of holes and electrons, respectively. The device 50 can be considered to be a propagating or traveling wave NIPI-type device, in that the repeating SAW wave potentials approximate a repeating sequence of n-type, intrinsic, p-type material.

A bipolar device provided according to the present invention is capable of being sampled at twice the frequency of the surface acoustic wave since both halves of the SAW period are used. Consequently, a circuit employing such a device automatically has double the available processing bandwidth, equal to the SAW frequency. These advantages are obtained with the minimal changes in material and electrode geometry outlined above.

Figure 8:
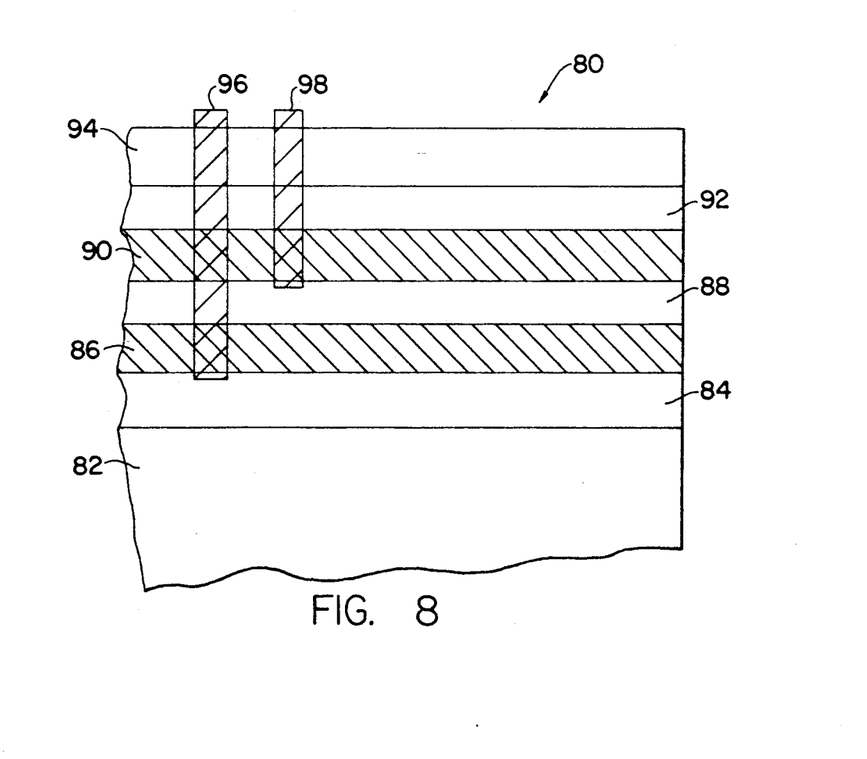
FIG. 8 is a partial, diagrammatic illustration of a multi-channel device embodying the present invention.

The above embodiments rely on the longitudinal separation of electrons and holes by the alternating positive and negative potential of the SAW. Both electrons and holes are transported in the same buried, undoped GaAs layer. In an additional, alternative embodiment of the present invention shown schematically in FIGS. 8 and 9, separate buried layers grown vertically are used, with each layer optimized for electron or hole transport. Referring now to FIG. 8, there is shown a multi-channel device 80 comprising a buffer layer 82 on which is grown a first AlGaAs layer 84. A first transport layer 86 is comprised of GaAs and is doped to optimize hole transport. A second AlGaAs layer 88 is grown on layer 86 which serves as a base for a second transport layer 90 of GaAs. Grown on the layer 90 is a third AlGaAs layer 92 on which is grown a cap layer 94 of GaAs. The second transport layer 90 formed with low level doping to minimize trapping effects in a manner similar to the first transport layer but for electrons rather than holes. Those skilled in the art will notice that the positions of the electron and hole layers and the respective contacts may be reversed to accomplish the same purpose.

Figure 9:
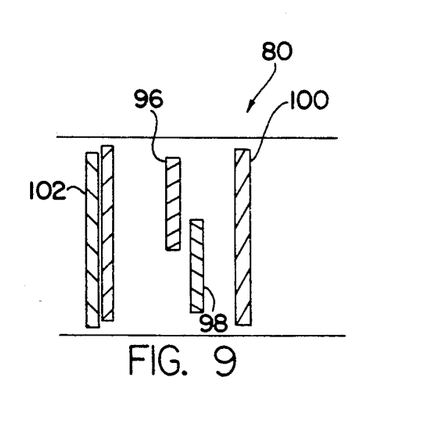
FIG. 9 is a top plan view of the multi-channel device of FIG. 8.

FIG. 9 is a top plan view of the multi-channel device 80 which is further characterized by charge injection contact structures 96, 98 that respectively inject electrons into transport layer 90 and holes into transport layer 86. These structures may be fabricated in a known manner such as by ion implantation of separate ohmic contacts such that carrier recombination is avoided. In the device 80, contact structure 96 is a p-type contact implanted to a depth of the device corresponding to the hole transport level, while contact structure 98 comprises an M-type contact laterally displaced from contact structure 96 and extending into the device only to the electron transport level. Also visible in FIG. 9 are a portion of modulation structure 100 and transducer 102 which are of a type as described above. Note also that contact or electrode structures 96, 98 may be laterally spaced from one another to provide electrical isolation and may also be comprised of a periodic array of contact or electrode structures so as to effectively provide electron and hole charge modulation and injection.

Similarly, although the invention has been shown and described with respect to a preferred embodiment thereof, it should be understood by those skilled in the art that various other changes, omissions and additions thereto may be made therein without departing from the spirit and scope of the present invention. For example, a bipolar device provided in accordance with the present invention can be made with combinations of various materials provided that the band structures of the quantum wells therefor support potential minima for both electrons and holes such as in the GaAs/AlGaAs material system. Note that electron and hole injection can be provided by sources laterally offset from the transport channel as well.

We claim:

1. An acoustic charge transport device comprising:
   a transducer means fabricated on a surface of a gallium arsenide structure for launching along a propagation axis surface acoustic waves having a wavelength and characterized by maxima and minima of electrical potential which transport both electrons and electrical "holes" provided thereto;
   a first electrode means for providing electrical "holes" to said gallium arsenide structure;

a second electrode means spaced from said first electrode means along said propagation axis approximately one half said surface acoustic wave wavelength, for providing electrons to said gallium arsenide structure a transport channel in said gallium arsenide structure having a major dimension extending parallel to said propagation axis characterized by an intrinsic vertical electrical potential for providing lateral and vertical confinement of both electrons and electrical "holes" presented thereto for transport by said surface acoustic waves;

a third electrode means for providing signals to modulate said propagating electrons and electrical "holes";

a fourth electrode means configured with said transport channel at an end thereof distal to said transducer means for providing an electrical signal equivalent of said modulated propagating electrons and electrical "holes";

said gallium arsenide structure fabricated in accordance with the steps of growing a first layer of aluminum gallium arsenide on a gallium arsenide substrate;

growing a first layer of gallium arsenide on said aluminum gallium arsenide layer;

growing a second layer of aluminum gallium arsenide on said first layer of gallium arsenide;

doping said second layer of aluminum gallium arsenide;

growing a cap layer on said second layer of aluminum gallium arsenide;

said second layer of aluminum gallium arsenide being doped to provide electrical charge to satisfy uncompensated surface states in said first gallium arsenide layer.

2. The device of claim 1 wherein said cap layer comprises a second layer of gallium arsenide for chemically passivating the device.

3. The device of claim 1 wherein said cap layer comprises a layer of aluminum nitride for providing electrical and chemical passivation of the device.

4. The device of claim 1 further comprising a reflector means configured on said gallium arsenide structure between said transducer means and an end of said gallium arsenide structure, said reflector means for reflecting said surface acoustic waves towards said transport channel.

5. The device of claim 1 wherein said first and second electrodes further comprise a laterally separated p-type and n-type structure, respectively.

6. The device of claim 5 wherein said first and second electrodes further comprise laterally separated p-type and n-type structures periodically configured in said gallium arsenide structure along the length thereof.

7. An electrical circuit comprising:
an acoustic charge transport device including
a transducer means fabricated on a surface of a gallium arsenide structure for launching along a propagation axis surface acoustic waves having a wavelength and a frequency and characterized by maxima and minima of electrical potential which transport both electrons and electrical "holes" provided thereto;

a first electrode means for providing electrical "holes" to said gallium arsenide structure;

a second electrode means spaced along said propagation axis approximately one half said surface acoustic wavelength, for providing electrons to said gallium arsenide structure a transport channel in said gallium arsenide structure having a major dimension extending parallel to said propagation axis characterized by an intrinsic vertical electrical potential for providing lateral and vertical confinement of both electrons and electrical "holes" presented thereto for transport by said surface acoustic waves;

a third electrode means for providing signals to modulate said propagating electrons and electrical "holes";

a fourth electrode means configured with said transport channel at an end thereof distal to said transducer means for providing an electrical signal equivalent of said modulated propagating electrons and electrical "holes";

said gallium arsenide structure fabricated in accordance with the steps of growing a first layer of aluminum gallium arsenide on a gallium arsenide substrate;

growing a first layer of gallium arsenide on said aluminum gallium arsenide layer;

growing a second layer of aluminum gallium arsenide on said first layer of gallium arsenide;

doping said second layer of aluminum gallium arsenide;

said second layer of aluminum gallium arsenide being doped to provide electrical charge to satisfy uncompensated surface states in said first gallium arsenide layer; and an electrical means for sampling signals from said fourth electrode means at a rate approximately equal to twice said surface acoustic wave frequency.

8. The device of claim 7 wherein said structure is further fabricated in accordance with the step of growing a cap layer on said second layer of aluminum gallium arsenide.

9. An acoustic charge transport device comprising:
a first transducer means fabricated on a surface of a gallium arsenide structure for launching along a propagation axis surface acoustic waves having a wavelength and a frequency and characterized by maxima and minima of electrical potential which transport electrons and electrical "holes" provided thereto;

a first electrode means for providing electrical "holes" to said gallium arsenide structure;

a second electrode means spaced along said propagation axis approximately one half said surface acoustic wavelength, for providing electrons to said gallium arsenide structure;

a first transport channel in said gallium arsenide structure having a major dimension extending parallel to said propagation axis characterized by an intrinsic vertical electrical potential for providing lateral and vertical confinement of electrical "holes" presented thereto for transport by said surface acoustic waves;

a second transport channel in said gallium arsenide structure having a major dimension extending parallel to said propagation axis characterized by an intrinsic vertical electrical potential for providing lateral and vertical confinement of electrons presented thereto for transport by said surface acoustic waves;

a third electrode means for providing signals to modulate said propagating electrons and electrical "holes";

a fourth electrode means configured with said transport channel at an end thereof distal to said transducer means for providing an electrical signal equivalent of said modulated propagating electrons and electrical "holes";

said gallium arsenide structure fabricated in accordance with the steps of:

growing a first layer of aluminum gallium arsenide on a gallium arsenide substrate;

growing a first layer of gallium arsenide on said aluminum gallium arsenide layer;

growing a second layer of aluminum gallium arsenide on said first layer of gallium arsenide;

doping said second layer of aluminum gallium arsenide;

growing a second layer of gallium arsenide on said second aluminum gallium arsenide layer;

growing a third layer of aluminum gallium arsenide on said second layer of gallium arsenide;

doping said third layer of aluminum gallium arsenide;

said second and third layers of aluminum gallium arsenide being doped to provide electrical charge to satisfy uncompensated surface states in said first and second gallium arsenide layers;

said first electrode means configured to electrically contact said first layer of gallium arsenide but not said second layer of gallium arsenide and second electrode means configured to electrically to contact said second layer of gallium arsenide but not said first layer of gallium arsenide.

10. The device of claim 9 wherein said structure is further fabricated in accordance with the step of growing a cap layer on said third layer of aluminum gallium arsenide.

11. The device of claim 9 wherein said first and second electrodes further comprise a laterally separated p-type and n-type structure, respectively.

12. The device of claim 11 wherein said first and second electrodes further comprise laterally separated p-type and n-type structures periodically configured in said gallium arsenide structure along the length thereof.

13. An electrical circuit, comprising:

an acoustic charge transport device comprising:

a first transducer means fabricated on a surface of a gallium arsenide structure for launching along a propagation axis surface acoustic waves having a wavelength and a frequency and characterized by maxima and minima of electrical potential which transport electrons and electrical "holes" provided thereto;

a first electrode means for providing electrical "holes" to said gallium arsenide structure;

a second electrode means spaced along said propagation axis approximately one half said surface acoustic wavelength, for providing electrons to said gallium arsenide structure;

a first transport channel in said gallium arsenide structure having a major dimension extending parallel to said propagation axis characterized by an intrinsic vertical electrical potential for providing lateral and vertical confinement of electrical "holes" presented thereto for transport by said surface acoustic waves;

a second transport channel in said gallium arsenide structure having a major dimension extending parallel to said propagation axis characterized by an intrinsic vertical electrical potential for providing lateral and vertical confinement of electrons presented thereto for transport by said surface acoustic waves;

a third electrode means for providing signals to modulate said propagating electrons and electrical "holes";

a fourth electrode means configured with said transport channel at an end thereof distal to said transducer means for providing an electrical signal equivalent of said modulated propagating electrons and electrical "holes";

said gallium arsenide structure fabricated in accordance with the steps of:

growing a first layer of aluminum gallium arsenide on a gallium arsenide substrate;

growing a first layer of gallium arsenide on said aluminum gallium arsenide layer;

growing a second layer of aluminum gallium arsenide on said first layer of gallium arsenide;

doping said second layer of aluminum gallium arsenide;

growing a second layer of gallium arsenide on said second aluminum gallium arsenide layer;

growing a third layer of aluminum gallium arsenide on said second layer of gallium arsenide;

doping said third layer of aluminum gallium arsenide;

said second and third layers of aluminum gallium arsenide being doped to provide electrical charge to satisfy uncompensated surface states in said first and second gallium arsenide layers;

said first electrode means configured to electrically contact said first layer of gallium arsenide but not said second layer of gallium arsenide and second electrode means configured to electrically to contact said second layer of gallium arsenide but not said first layer of gallium arsenide; and an electrical means for sampling signals from said fourth electrode means at a rate approximately equal to twice said surface acoustic wave frequency.

* * * * *